(12) United States Patent
Kim et al.

(10) Patent No.: US 12,308,365 B2
(45) Date of Patent: May 20, 2025

(54) THIN FILM STRUCTURE INCLUDING METHOD OF MANUFACTURING

(71) Applicant: Samsung Electronics Co., Ltd., Suwon-si (KR)

(72) Inventors: Hyungjun Kim, Suwon-si (KR); Changsoo Lee, Seoul (KR); Yong-Hee Cho, Suwon-si (KR); Yongsung Kim, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 97 days.

(21) Appl. No.: 17/844,896

(22) Filed: Jun. 21, 2022

(65) Prior Publication Data
US 2022/0406884 A1    Dec. 22, 2022

(30) Foreign Application Priority Data

Jun. 21, 2021  (KR) .................. 10-2021-0080438
Feb. 25, 2022  (KR) .................. 10-2022-0025498

(51) Int. Cl.
*H10B 12/00*    (2023.01)
*H01L 49/02*    (2006.01)

(52) U.S. Cl.
CPC .......... *H01L 28/56* (2013.01); *H10B 12/373* (2023.02)

(58) Field of Classification Search
CPC ....... H01L 28/56; H10B 12/00; H10B 12/373; H10B 12/377
USPC ........................................ 257/309
See application file for complete search history.

(56) References Cited

U.S. PATENT DOCUMENTS

| 7,265,483 B2 | 9/2007 | Takeda et al. |
| 8,409,879 B2 | 4/2013 | Wu et al. |
| 10,043,655 B2 | 8/2018 | Swaminathan et al. |
| 10,186,570 B2 | 1/2019 | Hendrix et al. |

(Continued)

FOREIGN PATENT DOCUMENTS

| JP | H08330186 A | 12/1996 |
| JP | H 3684059 B2 | 7/1999 |

(Continued)

OTHER PUBLICATIONS

Korean Office Action dated May 7, 2024 issued in Korean Patent Application No. 10-2022-0025498.

(Continued)

*Primary Examiner* — Chuong A Luu
(74) *Attorney, Agent, or Firm* — Harness, Dickey & Pierce, P.L.C.

(57) ABSTRACT

Provided are a thin film structure, a capacitor including the thin film structure, a semiconductor device including the thin film structure, and a method of manufacturing the thin film structure, in which the thin film structure may include: a first electrode thin film disposed on a substrate and including a first perovskite-based oxide; and a protective film disposed on the first electrode thin film and including a second perovskite-based oxide that is oxygen-deficient and includes a doping element. The thin film structure may prevent the deterioration of conductivity and a crystalline structure of a perovskite-based oxide electrode, which is a lower electrode, even in a high-temperature oxidizing atmosphere for subsequent dielectric film deposition.

16 Claims, 15 Drawing Sheets

(56) References Cited

U.S. PATENT DOCUMENTS

| | | | |
|---|---|---|---|
| 2019/0148067 | A1 | 5/2019 | Hirata |
| 2019/0148390 | A1 | 5/2019 | Frank |
| 2019/0165088 | A1 | 5/2019 | Cho et al. |
| 2019/0267383 | A1 | 8/2019 | Rocklein et al. |
| 2019/0355806 | A1 | 11/2019 | Kang et al. |
| 2020/0020780 | A1 | 1/2020 | Kim |
| 2020/0312952 | A1 | 10/2020 | Cho et al. |
| 2020/0321472 | A1 | 10/2020 | Ramamoorthy et al. |
| 2021/0143351 | A1* | 5/2021 | Huang .................. H10K 85/50 |
| 2021/0391412 | A1 | 12/2021 | Lee et al. |

FOREIGN PATENT DOCUMENTS

| | | |
|---|---|---|
| JP | 2000-269463 A | 9/2000 |
| JP | 2005-039292 A | 2/2005 |
| KR | 2000-0029860 A | 5/2000 |
| KR | 2001-0045568 A | 6/2001 |
| KR | 10-2021-0059428 A | 5/2021 |

OTHER PUBLICATIONS

D. Olaya et al., "Electrical properties of La-doped strontium titanate thin films," Appl. Phys. Lett. Vol. 80, No. 16, pp. 2928-2930 (2002).

K. Wang et al., "Perovskite Oxide Catalysts for Advanced Oxidation Reactions," Adv. Funct. Mater. No. 31, 2102089, pp. 1-31 (2021).

J.A. Kittl, et al. "Microelectronic Engineering," Microelectronic Engineering, No. 86, pp. 1789-1795, (2009).

J.H. Shim, et al. "Process-property relationship in high-k ALD SrTiO3 and BaTiO3: a review", Journal of Materials Chemistry C. No, 5, pp. 8000-8013 (2017).

Sang Woon Lee, et al. "Atomic Layer Deposition of SrTiO3 Thin Films with Highly Enhanced Growth Rate for Ultrahigh Density Capacitors," Chemistry of Materials, No. 23, pp. 2227-2236 (2011).

Ryan Jacobs, et al. "Understanding and Controlling the Work Function of Perovskite Oxides Using Density Functional Theory," Advanced Functional Materials, pp. 1-12 (2016).

Germanicus, et al. "Three dimensional resistance mapping of self-organized Sr3V2O8 nanorods on metallic perovskite SrVo3 matrix," Applied Surface Science, vol. 510 145522, pp. 1-8, (2020).

R.A. De Souza "Oxygen Diffusion in SrTiO3 and Related Perovskite Oxides," Advanced Functional Materials, No. 25, pp. 6326-6342 (2015).

* cited by examiner

US 12,308,365 B2

THIN FILM STRUCTURE INCLUDING METHOD OF MANUFACTURING

CROSS-REFERENCE TO RELATED APPLICATIONS

This application is based on and claims priority under 35 U.S.C. § 119 to Korean Patent Application No. 10-2021-0080438, filed on Jun. 21, 2021, in the Korean Intellectual Property Office, and Korean Patent Application No. 10-2022-0025498, filed on Feb. 25, 2022, in the Korean Intellectual Property Office, the disclosures of each of which are incorporated by reference herein in their entirety.

BACKGROUND

Some example embodiments relate to a thin film structure, a capacitor including the thin film structure, a semiconductor device including the thin film structure, and/or a method of manufacturing the thin film structure.

Important characteristic for a dielectric material for DRAM capacitors may include the dielectric constant of an electrostatic capacity material, which is related to an amount of charge per unit area. As components are integrated, structural improvement has been made not only by improving material properties but also by improving process capability. However, in a situation where improvement of physical structures has reached a limit, the development of new materials is being pursued to realize physical properties that exceed those of existing materials.

In order to replace $SiO_2/SiN_x$, $Al_2O_3$, or the like, which have been used as dielectric materials of existing capacitors, studies have been actively conducted on perovskite-based oxides, such as binary oxides such as $HfO_2$, $Ta_2O_5$, $TiO_2$, and $ZrO_2$, and ternary oxides such as $SrTiO_3$ and $(Ba,Sr)TiO_3$, as high-dielectric candidate materials. Perovskite-based oxides can increase the capacitance per unit area due to its higher dielectric constant compared to the binary oxide, so integration is possible. However, in order to secure the dielectric properties of a perovskite-based oxide dielectric film, it may be important to improve the crystallinity of the dielectric film. To this end, by applying a perovskite-based electrode material having the same structure to the lower electrode material to be deposited, it may be possible to induce crystallization and improve the crystallinity of the dielectric film.

Nonetheless, perovskite-based conductive oxide materials that may be applied as a lower electrode tend to show deterioration in the crystalline structure and thus the conductivity properties, due to changes in the oxidation number of B-site ions in a high-temperature oxidizing environment of a subsequent dielectric film deposition process. Therefore, there is a need or a desire for a technology capable of preventing or reducing deterioration of physical properties of perovskite-based conductive oxide thin films in such a high-temperature oxidizing environment.

SUMMARY

Provided is a thin film structure including an antioxidant protective film that may prevent or reduce deterioration of a lower electrode even in a high-temperature oxidizing environment of a subsequent dielectric film deposition process.

Alternatively or additionally, provided is a capacitor including the thin film structure.

Alternatively or additionally, provided is a semiconductor device including the thin film structure.

Alternatively or additionally, provided is a method of preparing the thin film structure.

According to some example embodiments, a thin film structure may include a first electrode thin film on a substrate and including a first perovskite-based oxide; and protective film disposed on the first electrode thin film and including a second perovskite-based oxide that is oxygen-deficient and may include a doping element.

Additional aspects will be set forth in part in the description which follows and, in part, will be apparent from the description, or may be learned by practice of various example embodiments.

BRIEF DESCRIPTION OF THE DRAWINGS

The above and other aspects, features, and advantages of various example embodiments will be more apparent from the following description taken in conjunction with the accompanying drawings, in which:

FIG. 5A is an HR-TEM image showing an as-deposited state of a protective film having a thickness of 26 Å on a $SrVO_3$ oxide electrode thin film in Comparative Example 3;

FIG. 5B is an HR-TEM image of an amorphous state of a $SrVO_3$ oxide electrode thin film after exposure to a high-temperature oxidizing environment after depositing a protective film having a thickness of 26 Å in Comparative Example 3;

FIG. 5C is an HR-TEM image of a crystalline state of a $SrVO_3$ oxide electrode thin film after exposure to a high-temperature oxidizing environment after depositing a protective film having a thickness of 45 Å in Example 1;

FIG. 5D is an HR-TEM image of a crystalline state of a $SrVO_3$ oxide electrode thin film after exposure to a high-temperature oxidizing environment after depositing a protective film having a thickness of 230 Å in Example 2.

DETAILED DESCRIPTION OF VARIOUS EXAMPLE EMBODIMENTS

Figure 1:
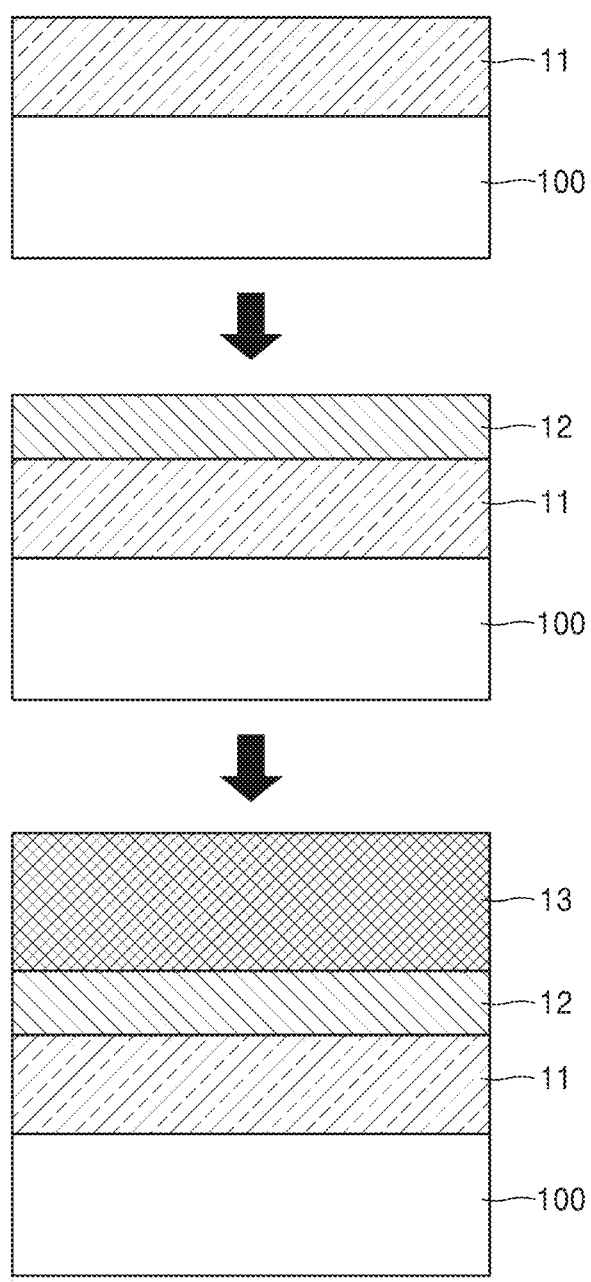
FIG. 1 shows a manufacturing process of a thin film structure according to some example embodiments.

Reference will now be made in detail to various embodiments, some examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various embodiments are shown in the accompanying drawings. However, inventive concepts may be embodied in many different forms, and should not be construed as limited to example embodiments described herein. Rather, these embodiments are provided to enable some example embodiments to be thorough and complete, and will fully convey the scope of inventive concepts to one of ordinary skill in the art. The same reference numeral refers to the same component.

It will be understood that when a component is referred to as being "on" another component, it may be directly on top of the other component, or another component may be interposed therebetween. In contrast, when a component is referred to as being "directly on" another component, another component is not interposed therebetween.

The terms "first", "second", "third", or the like may be used herein to describe various elements, components, regions, layers, and/or areas, but these elements, components, regions, layers, and/or areas should not be limited by these terms. These terms are only used to distinguish one element, component, region, layer, or area from another element, component, region, layer, or area. Accordingly, a first element, component, region, layer, or area described herein may be referred to as a second component, component, region, layer, or are without departing from the teachings described herein.

The terms used herein are for describing specific embodiments only and are not intended to limit inventive concepts. The singular form as used herein is intended to include the plural form including "at least one", unless it has a clearly different meaning in the context. "At least one" should not be construed as limiting to the singular form. The term "and/or" as used herein may include any and all combinations of one or more of the list items. As used in the detailed description, the terms "includes" and/or "including" specify the presence of specified features, regions, integers, steps, actions, elements, and/or components, and do not exclude the presence or addition of one or more other features, regions, integers, steps, actions, elements, components, and/or groups thereof.

Spatially relative terms, such as "below", "lower", "bottom", "above", "higher", "top", or the like, are used herein to easily describe the relationship between one element or feature and another element or feature. It will be understood that the spatially relative terms are intended to include different directions of a device in use or operation in addition to the directions shown in the drawings. For example, when a device in the drawing is overturned, elements described as "below" or "under" other elements or features will be oriented "above" the other elements or features. Thus, the example term "under" may encompass both upward and downward directions. The device may be arranged in different directions (rotated 90 degrees or rotated in different directions), and the spatially relative terms used herein may be interpreted accordingly.

Unless defined otherwise, all terms (including technical and scientific terms) used herein have the same meaning as the terms commonly understood by one of ordinary skill in the art to which some example embodiments pertains. In addition, it will be understood that terms as defined in commonly used dictionaries should be construed as having meanings consistent with those in the related art and in the context of some example embodiments, and should not be construed as idealized and/or overly formal.

Example embodiments are described herein with reference to schematic cross-sectional views of idealized embodiments. As such, changes in the shape in the drawings should be expected as a result of, for example, manufacturing techniques and/or tolerances. Therefore, various example embodiments described herein should not be interpreted as being limited to specific shapes of area as shown in the present specification, but should include deviations of shapes resulting from, for example, the manufacture. For example, areas depicted or described as being flat may typically have rough and/or nonlinear features. Moreover, the sharply illustrated angle may be round. Therefore, the areas shown in the drawings are essentially schematic, and the shapes are not intended to show the exact shape of the area, and are not intended to limit the scope of the claims.

Unless otherwise specified or clear from context, "group" when referencing particular elements may refer to a group of the Periodic Table of the Elements according to the International Union of Pure and Applied Chemistry (IUPAC) Group 1-18 group classification system.

Although various example embodiments are described, alternatives, modifications, variations, improvements, and substantial equivalents that are not currently anticipated may occur to the applicant or one of ordinary skill in the art. Accordingly, the appended claims, which may be filed and amended, are intended to cover all such alternatives, modifications, variations, improvements, and substantial equivalents.

Hereinafter, a thin film structure according to some example embodiments, a capacitor including the thin film structure, a semiconductor device including the thin film structure, and/or a method of manufacturing the thin film structure will be described in more detail.

According to some example embodiments, a thin film structure may include a first electrode thin film on a substrate and including a first perovskite-based oxide; and protective film disposed on the first electrode thin film and including a second perovskite-based oxide that is oxygen-deficient and may include a doping element. As used herein, unless otherwise specified or clear from context a "perovskite-based oxide" may be or may refer to an oxide having a structure of or corresponding to a crystal structure such as that of perovskite.

According to some example embodiments, the second perovskite-based oxide may be represented by Formula 1:

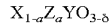
$$X_{1-a}Z_aYO_{3-\delta}$$ Formula 1 wherein, in Formula 1, Z may be a divalent element, Y may be a quadvalent element, Z may be a doping element that, through doping, causes a biaxial strain ratio of the second perovskite-based oxide to be greater than or equal to −1% and less than or equal to 3%, and 0<a<1 and 0<δ<0.5.

The protective film may serve as an oxidation protecting film or oxidation reducing film of the first electrode, and the thin film structure may prevent or reduce deterioration of a conductivity and a crystalline structure of the first electrode including a perovskite-based oxide, which is a lower electrode, in a high-temperature oxidizing atmosphere for subsequent dielectric film deposition. The protective film may have electrically conductive properties, the conductive properties based on or by including oxygen vacancies or doping elements.

The oxidation reducing property of the protective film may be generated by at least partially suppressing a reaction from external oxidation environment and a subsequent oxide thin film interface by at least partially blocking movement of oxygen and oxygen vacancy within the protective film. When oxygen deficiency is great, oxygen blocking ability may decrease. However, the second perovskite-based oxide may contain a doping element along with oxygen deficiency to at least partially compensate for a problem of oxygen deficiency and to more stably create a crystalline structure of the first electrode.

The second perovskite-based oxide may be or may include a doping element, wherein, in case of doping, a biaxial strain ratio of the second perovskite-based oxide is in a range of about −1% to about −3%, as compared with the biaxial strain ratio before doping. The doping element may be implanted into the second perovskite-based oxide, and/or may be incorporated during deposition of the second perovskite-based oxide. For example, the second perovskite-based oxide may include a doping element having a biaxial strain ratio in a range of about −1.5% to about −2.5% or more particularly, about −2%, by doping. When the biaxial strain ratio of the doped second perovskite-based oxide formed on the first electrode by doping is within this range, oxygen diffusivity may be further reduced, and phase stability of the first electrode may be secured or more likely to be secured. The doping element may be, for example, Ce, La, Pr, Sn, Ge, N, V, or a combination thereof, but embodiments are not limited thereto.

In some example embodiments, in Formula 1, X may be at least one element selected from Sr, Ca, and Ba.

In some example embodiments, in Formula 1, Y may be at least one element selected from Ti, Zr, and Hf.

In some example embodiments, in Formula 1, Z may be Ce, La, Pr, Sn, Ge, N, V, or a combination thereof.

In Formula 1, "a" represents a doping concentration of a doping element (Z), wherein 0<a<1, or for example, 0.01≥a≥0.5. In Formula 2, "δ" represents an oxygen deficiency concentration, wherein 0<δ<0.5, or for example, 0.05≥δ≥0.3. When "a" and "δ" are within any of these ranges, deterioration of the first electrode may be prevented or reduced in likelihood of occurrence and/or impact from occurring, by effectively reducing or at least significantly reducing the oxygen diffusivity of the protective film.

In some example embodiments, the second perovskite-based oxide may be, for example, a compound represented by Formula 2:

$Sr_{1-a}Z'_aTiO_{3-\delta}$  Formula 2 wherein, in Formula 2, Z' may be Ce, La, Pr, Sn, Ge, N, V, or a combination thereof, and 0.01≥a≥0.5 and 0.05≥δ≥0.3.

In some example embodiments, the second perovskite-based oxide may be, for example, $Sr_{1-a}Ce_aTiO_{3-\delta}$, $Sr_{1-a}La_aTiO_{3-\delta}$, $Sr_{1-a}Pr_aTiO_{3-\delta}$, $Sr_{1-a}Sn_aTiO_{3-\delta}$, $Sr_{1-a}Ge_aTiO_{3-\delta}$, $Sr_{1-a}N_aTiO_{3-\delta}$, $Sr_{1-a}V_aTiO_{3-\delta}$, $Sr_{1-a}Ce_aZrO_{3-\delta}$, $Sr_{1-a}La_aZrO_{3-\delta}$, $Sr_{1-a}Pr_aZrO_{3-\delta}$, $Sr_{1-a}Sn_aZrO_{3-\delta}$, $Sr_{1-a}Ge_aZrO_{3-\delta}$, $Sr_{1-a}N_aZrO_{3-\delta}$, $Sr_{1-a}V_aZrO_{3-\delta}$, $Sr_{1-a}Ce_aHfO_{3-\delta}$, $Sr_{1-a}La_aHfO_{3-\delta}$, $Sr_{1-a}Pr_aHfO_{3-\delta}$, $Sr_{1-a}Sn_aHfO_{3-\delta}$, $Sr_{1-a}Ge_aHfO_{3-\delta}$, $Sr_{1-a}N_aHfO_{3-\delta}$, $Sr_{1-a}V_aHfO_{3-\delta}$, $Ca_{1-a}Ce_aTiO_{3-\delta}$, $Ca_{1-a}La_aTiO_{3-\delta}$, $Ca_{1-a}Pr_aTiO_{3-\delta}$, $Ca_{1-a}Sn_aTiO_{3-\delta}$, $Ca_{1-a}Ge_aTiO_{3-\delta}$, $Ca_{1-a}N_aTiO_{3-\delta}$, $Ca_{1-a}V_aTiO_{3-\delta}$, $Ca_{1-a}Ce_aZrO_{3-\delta}$, $Ca_{1-a}La_aZrO_{3-\delta}$, $Ca_{1-a}Pr_aZrO_{3-\delta}$, $Ca_{1-a}Sn_aZrO_{3-\delta}$, $Ca_{1-a}Ge_aZrO_{3-\delta}$, $Ca_{1-a}N_aZrO_{3-\delta}$, $Ca_{1-a}V_aZrO_{3-\delta}$, $Ca_{1-a}Ce_aHfO_{3-\delta}$, $Ca_{1-a}La_aHfO_{3-\delta}$, $Ca_{1-a}Pr_aHfO_{3-\delta}$, $Ca_{1-a}Sn_aHfO_{3-\delta}$, $Ca_{1-a}Ge_aHfO_{3-\delta}$, $Ca_{1-a}N_aHfO_{3-\delta}$, $Ca_{1-a}V_aHfO_{3-\delta}$, $Ba_{1-a}Ce_aTiO_{3-\delta}$, $Ba_{1-a}La_aTiO_{3-\delta}$, $Ba_{1-a}Pr_aTiO_{3-\delta}$, $Ba_{1-a}Sn_aTiO_{3-\delta}$, $Ba_{1-a}Ge_aTiO_{3-\delta}$, $Ba_{1-a}N_aTiO_{3-\delta}$, $Ba_{1-a}V_aTiO_{3-\delta}$, $Ba_{1-a}Ce_aZrO_{3-\delta}$, $Ba_{1-a}La_aZrO_{3-\delta}$, $Ba_{1-a}Pr_aZrO_{3-\delta}$, $Ba_{1-a}Sn_aZrO_{3-\delta}$, $Ba_{1-a}Ge_aZrO_{3-\delta}$, $Ba_{1-a}N_aZrO_{3-\delta}$, $Ba_{1-a}V_aZrO_{3-\delta}$, $Ba_{1-a}Ce_aHfO_{3-\delta}$, $Ba_{1-a}La_aHfO_{3-\delta}$, $Ba_{1-a}Pr_aHfO_{3-\delta}$, $Ba_{1-a}Sn_aHfO_{3-\delta}$, $Ba_{1-a}Ge_aHfO_{3-\delta}$, or $Ba_{1-a}N_aHfO_{3-\delta}$, $Ba_{1-a}V_aHfO_{3-\delta}$, wherein, in the above formulae, a may be in a range of about 0.01 to about 0.5, and δ may be in a range of about 0.05 to about 0.3.

In some example embodiments, the thickness of the protective film may be about 4.5 nm or greater and about 1,000 nm or less, for example, about 5 nm to about 500 nm, or more specifically, about 10 nm to about 100 nm. When the thickness is within this range, a protective film may serve as an oxidation protecting or oxidation inhibiting or reducing film.

In the thin film structure, the first electrode may consist of, or may include, an oxide electrode material having the same perovskite-based crystalline structure as the perovskite-based dielectric material thin film having a high dielectric constant, to thereby improve crystallinity.

The first electrode may include a first perovskite-based oxide having electrical conductivity, and the first perovskite-based oxide may be at least one selected from compounds represented by Formulae 3 and 4:

$ABO_3$  Formula 3 wherein, in Formula 3, A may be at least one element selected from Sr, Ca, and Ba, and B may be at least one element selected from Ru, Nb, V, Ti, Fe, and Co, $La_{1-a}A_aMO_3$  Formula 4 in Formula 4, A may be at least one element selected from Sr, Ca, and Ba, and M may be at least one element selected from Sc, Ti, V, Cr, Mn, Fe, Co, Ni, Al, and Ru.

In some embodiments, the first perovskite-based oxide may include $SrRuO_3$, $SrNbO_3$, $SrVO_3$, $CaRuO_3$, $CaNbO_3$, $CaVO_3$, or a combination thereof.

In some example embodiments, a substrate in the thin film structure may include a third perovskite-based oxide. For example, the third perovskite-based oxide may be or may include a single crystalline substrate including $SrTiO_3$, La-doped $SrTiO_3$, Nb-doped $SrTiO_3$, $LaAlO_3$, $KTaO_3$, $LaSrAlO_4$, $(LaAlO_3)_{0.3}(Sr_2TaAlO_6)_{0.7}$, $YAlO_3$, $DyScO_3$, $TbScO_3$, $GdScO_3$, $EuScO_3$, $SmScO_3$, $NdScO_3$, $PrScO_3$, $CeScO_3$, $LaScO_3$, or a combination thereof.

As the thin film structure may include a protective film as described above on the first thin film, a perovskite crystalline structure of the first electrode thin film may be maintained even after exposure to a high-temperature oxidizing environment of 300° C. or greater; e.g. the perovskite crystalline structure of the first electrode thin film may be maintained outside of such a high-temperature oxidizing environment, and may be maintained within the high-temperature oxidizing environment.

The thin film structure may further include a dielectric material thin film disposed on the protective film and including a fourth perovskite-based oxide. As the fourth perovskite-based oxide, various perovskite-based oxides showing high dielectric constant properties of 100 or more may be used according to a purpose of use of the thin film structure. For example, when the thin film structure is applied to a DRAM, a high dielectric perovskite-based oxide, such as $Ba_{1-x}Sr_xTiO_3$ (BSTO), $SrTiO_3$ (STO), $CaTiO_3$, $PbTiO_3$, $BaZrO_3$, $BaSnO_3$, or $PbZrO_3$, may be used as a dielectric material thin film.

The thin film structure may further include a second electrode thin film including a fifth perovskite-based oxide on the dielectric material thin film. The second electrode thin film is a perovskite-based oxide having electrical conductivity, and the perovskite-based oxide used for the first electrode thin film, may also be used.

The thin film structure may be manufactured or fabricated as follows.

According to some example embodiments, a method of manufacturing the thin film structure may include: preparing a first electrode thin film disposed on a substrate and including a first perovskite-based oxide; and depositing a protective film on the first electrode thin film, the protective film including a second perovskite-based oxide that is oxygen-deficient and may include a doping element.

The depositing of the protective film may be performed by a physical vapor deposition selected from one or more of pulsed laser deposition (PLD), molecular beam epitaxy (MBE), and sputtering, performed individually or consecutively in any order or concurrently.

The depositing of the protective film may be performed in a low oxidation atmosphere. In some example embodiments, a partial pressure of oxygen in the depositing of the protective film may be in a range of about $10^{-5}$ Torr to about $10^{-8}$ Torr. In some example embodiments, depositing, on the protective film, a dielectric material thin film including a fourth perovskite-based oxide, and heat-treating the deposited dielectrical material thin film for crystallization.

A subsequent deposition of a dielectric material thin film may be performed under high-temperature oxidation conditions. In some example embodiments, the depositing of the dielectric material thin film may be performed in a presence of a reactive gas including ozone ($O_3$), oxygen ($O_2$), or a combination thereof, and a flow rate of the reactive gas may be in a range of about 500 sccm to about 3,000 sccm. In addition, the heat-treating for crystallization of the deposited dielectric material thin film may be performed at a temperature in a range of about 400° C. to about 700° C.

A capacitor according to some example embodiments may include the aforementioned thin film structure. The type of capacitor is not particularly limited; the capacitor may have, for example, various hysteresis properties, however, example embodiments are not limited thereto. A capacitor may be or may include, for example, a capacitor device included in a memory cell, a multilayer capacitor used in a multilayer ceramic capacitor, or the like.

The capacitor according to some example embodiments may include: a first electrode; a second electrode; and a dielectric material layer between the first electrode and the second electrode, wherein the first electrode may include the thin film structure described above.

Reviewing FIG. 1, initially a substrate 100 may be provided. The substrate 100 may be an insulating substrate; however, example embodiments are not limited thereto. On the substrate, a first electrode 11 may be deposited or formed.

Subsequently a protective film 12 may be deposited or formed.

Subsequently a dielectric thin film 13 may be deposited or formed.

Figure 2A:
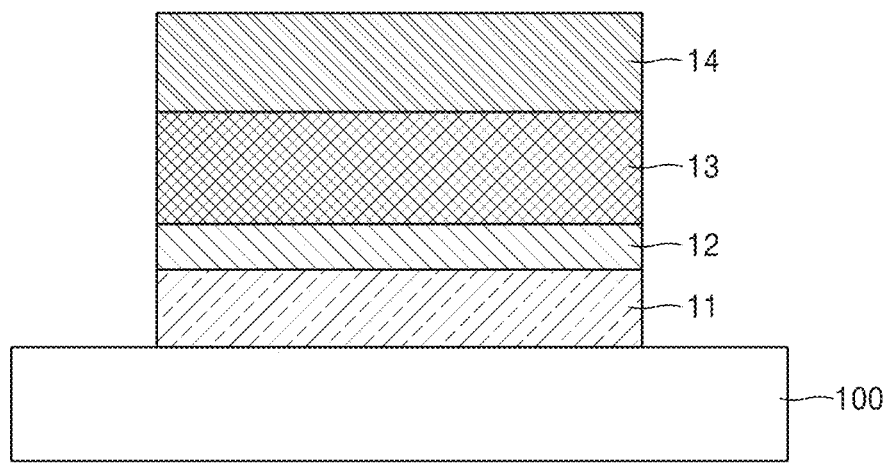
FIGS. 2A to 2D show schematic views of capacitors according to some example embodiments.

FIG. 2A shows a structure of a capacitor according to some example embodiments. In this structure, an insulating substrate 100 and a pair of electrodes, e.g., a first electrode 11, a protective film 12, a dielectric material thin film 13, and a second electrode 14 may be included. The first electrode 11 and the second electrode 14 may act as a lower electrode and an upper electrode, respectively. The first electrode 11 and the second electrode 14 may not be electrically connected, e.g. may not be electrically connected to each other, and the dielectric material thin film 13 may be between the first electrode 11 and the second electrode 14. At an interface between the first electrode 11 and the dielectric material thin film 13, the protective film 12 acting as an oxidation-protecting or an oxidation-inhibiting protective film may be disposed for improving crystallinity of the dielectric material thin film 13 and preventing or reducing deterioration of the first electrode 11. The capacitor may be planar; however, example embodiments are not necessarily limited thereto.

Figure 2B:
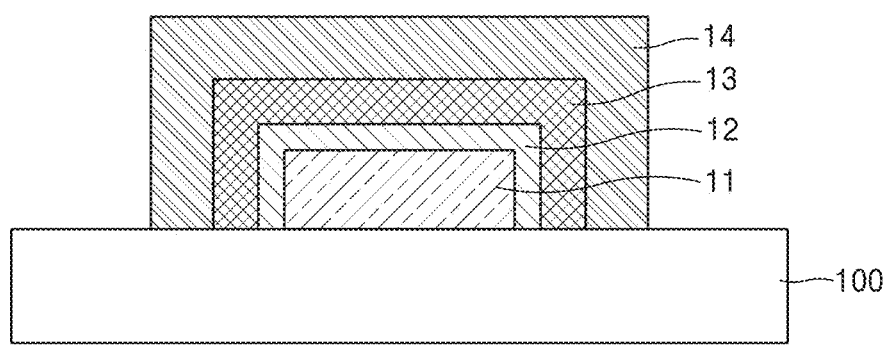
Figure 2C:
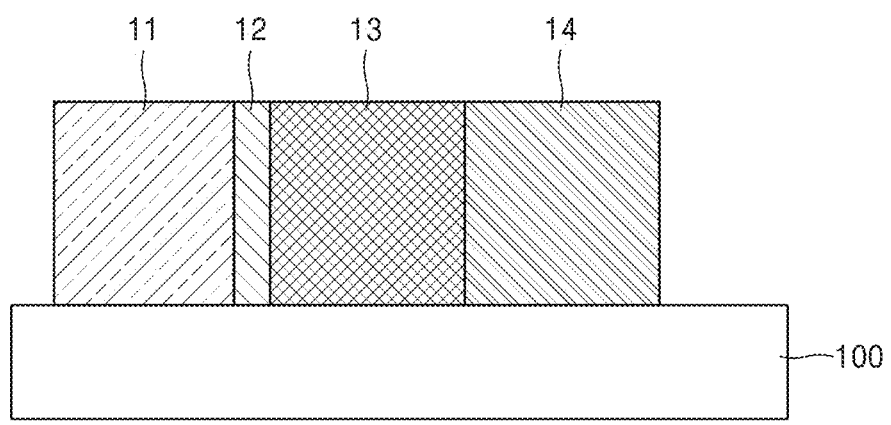
Figure 2D:
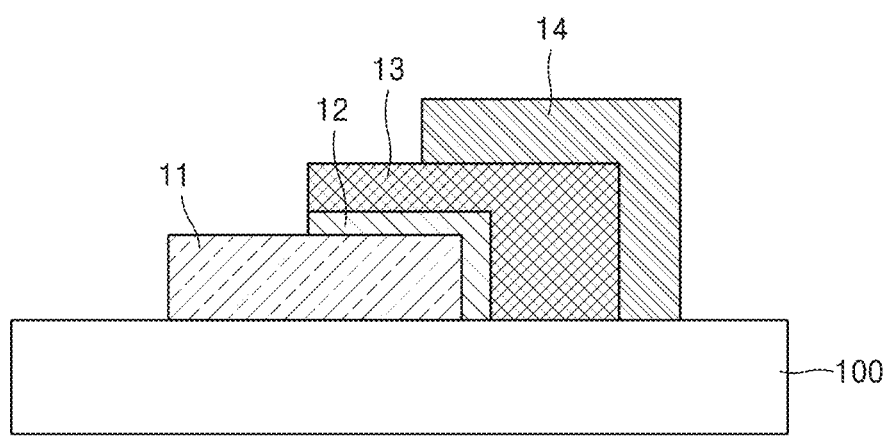

FIGS. 2B to 2D are some example embodiments of a structure of the capacitor. In FIG. 2B, the protective film 12 may cover or wrap around the first electrode 11 on the insulating substrate 100, the dielectric material thin film 13 may cover or warp around the protective film 12, and the second electrode 14 may cover the dielectric material thin film 13. In FIG. 2C, the first electrode 11, the protective film 12, the dielectric material thin film, 13 and the second electrode 14 may be sequentially on the insulating substrate 100. In FIG. 2D, the protective film 12 may cover a portion of, e.g. not all of, the first electrode 11 on the insulating substrate 100, the dielectric material thin film 13 may cover a portion of, e.g. not all of, the protective film 12, and the second electrode 14 may cover another portion of the dielectric material thin film 13. The protective film 12 may cover at least an interface between the first electrode 11 and the dielectric material thin film 13 on a surface of the first electrode 11.

The dielectric material thin film 13 may be formed, for example, by using one or more of a chemical vapor deposition process, an organometallic chemical vapor deposition process, a liquid phase epitaxy process, a sol-gel process, a sputtering process, a pulse laser deposition process, and the like.

The first electrode 11 and the second electrode 14 may each independently or concurrently include, for example, strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide (($Ba,Sr)RuO_3$), iridium (Ir), iridium-ruthenium alloy (IrRu), iridium oxide ($IrO_2$), titanium-aluminum nitride (TiAlN), titanium oxide ($TiO_2$), ruthenium (Ru), platinum (Pt), zirconium oxide ($ZrO_2$), tin oxide ($SnO_2$), and indium-tin oxide (ITO), but embodiments are not limited thereto, and may include the same or different materials. Any suitable electrode material available may be used. The materials may be used alone or in combination with each other.

The first electrode 11 and second electrode 14 may be formed by depositing one or more of metal, metal oxide, metal nitride, metal nitric oxide, or alloy by one or more of an electron-beam deposition process, a chemical vapor deposition process, a sputtering process, an atomic layer lamination process, a pulse laser deposition process, or the like. Either or both of the first electrode 11 and the second electrode 14 may have a single-layer structure or a multilayer structure.

In some example embodiments, either or both of the first electrode 11 and the second electrode 14 may be formed by heat-treating a coating film obtained by coating and drying an electrode paste containing a conductive material.

As a coating method may not use either or both of a vacuum process or a high-temperature process, the first electrode 11 and the second electrode 14 may more easily be manufactured.

The electrode paste may contain one or more of conductive material particles, an organic component, and a solvent.

As the conductive material, any suitable material used as an electrode may be used. For example, the conductive material may include one or more of an electrically conductive metal oxide, such as one or more of tin oxide, indium oxide, tin indium oxide (ITO); a metal, such as platinum, gold, silver, copper, iron, tin, zinc, aluminum, indium, chromium, lithium, sodium, potassium, cesium, calcium, magnesium, palladium, molybdenum, amorphous silicon, polysilicon, or an alloy such as a homogenized allow thereof; an inorganic electrically conductive material, such as one or more of copper iodide or copper sulfide; an electrically conductive polymer of which conductivity is improved by doping of complexes, such as one or more of polythiophene, polypyrrole, polyaniline, polyethylene dioxathiophene, or polystyrene sulfonic acid complex; and carbon materials. Such an electrically conductive material may be used alone, but a laminate or a mixture of the electrically-conductive materials may also be used.

A conductive material may be, for example, a metal particle. By using a metal particle, a bending resistance of the capacitor may not be improved, and a coercive field may not increase even when a voltage is repeatedly applied. In this case, adhesion between an electrode and a dielectric material single-layer thin film may be improved by an anchor effect generated by formation of unevenness on a surface of the conductive film and the dielectric material single-layer thin film on the unevenness. The metal particle may include, for example, at least one selected from gold, silver, copper, platinum, lead, tin, nickel, aluminum, tungsten, molybdenum, ruthenium oxide, chromium, titanium, carbon, and indium.

A semiconductor device according to another embodiment may include the thin film structure. As the semiconductor device may include the thin film structure, excellent physical properties may be provided.

The semiconductor device may be or may include, for example, a memory device such as but not limited to a dynamic random access memory (DRAM) device.

Figure 3A:
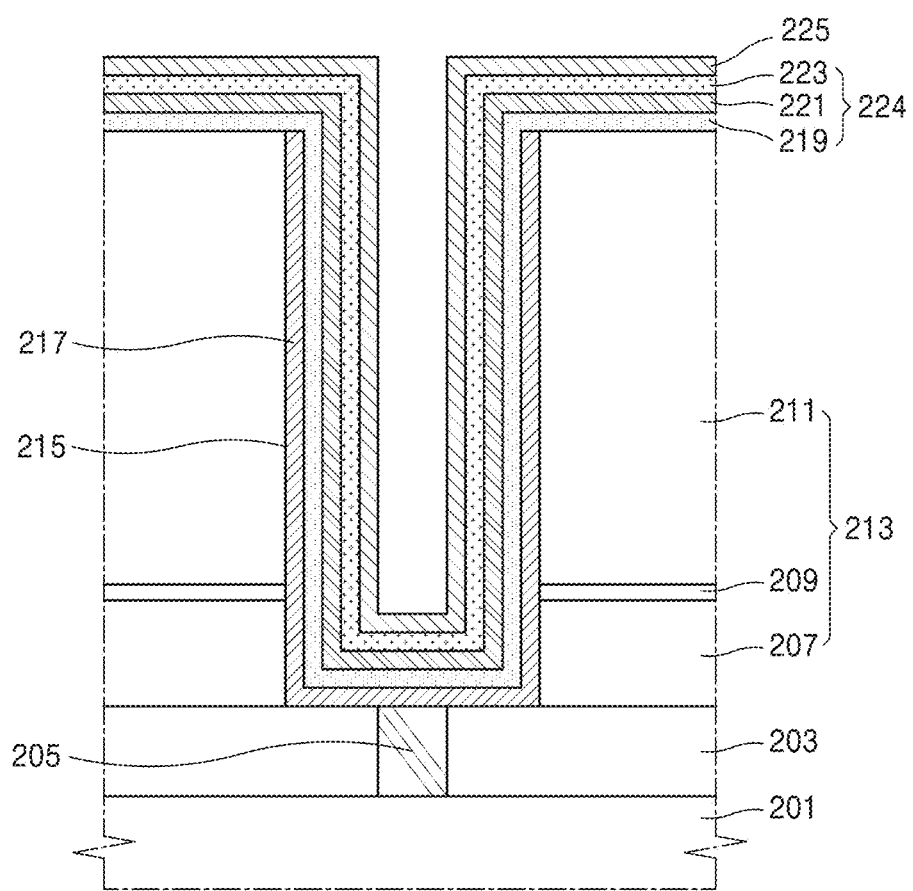
FIG. 3A shows a cross-sectional view of a metal-insulator-metal (MIM) capacitor according to some example embodiments.

FIG. 3A shows a structure of a MIM capacitor according to another embodiment.

An interlayer insulating film 203 may be laminated on the semiconductor substrate 201, and a contact plug 205 filling a contact hole exposing the semiconductor substrate 201 may be formed thereon. A mold insulating film 213 may be formed on the substrate having the contact plug 205, and the mold insulating film 213, as shown in FIG. 3A, may have a structure in which a lower mold insulating film 207, an etch stopping layer 209, and an upper mold film 211 are sequentially stacked on the substrate having the contact plug 205. The etch stopping layer 209 is not limited to the position shown in FIG. 3A and may be directly formed on an upper surface of the contact plug 205 and an upper surface of the interlayer insulating film 203. In some example embodiments, the mold insulating film 213 may be formed of a double-layered mold insulating film of the lower mold insulating film 207 and the upper mold insulating film 211 or formed of a single mold insulating film (a single mold insulating layer). The lower mold insulating film 207 and the upper mold insulating film 211 may have an etch selectivity ratio with respect to the etch stopping layer 209. For example, when the lower mold insulating film 207 and the upper mold insulating film 213 are formed of or include a silicon oxidation film, the etch stopping layer 209 may be formed of or include a silicon nitride film. The mold insulating film 213 may be patterned to form a storage node hole 215 exposing an upper surface of the contact plug 205 and an upper surface of the interlayer insulating film adjacent thereto.

A lower electrode film 217, for example, a conductive film for a lower electrode, may be formed on a first, front surface of a semiconductor substrate having the storage node hole 215. The conductive film 217 for a lower electrode may be formed as a conductive film with improved or excellent step-coating properties, less deformation during a subsequent dielectric material film forming process, and/or oxidation resistant or partially-resistant property. The conductive film 217 for a lower electrode may include the thin film structure according to some example embodiments. In addition, the conductive film 217 for a lower electrode may further include, for example, at least one metal nitride layer selected from titanium nitride film (TiN), titanium silicon nitride film (TiSiN), titanium aluminum nitride film (TiAlN), tantalum nitride film (TaN), tantalum silicon nitride film (TaSiN), tantalum aluminum nitride (TaAlN), and tungsten nitride (WN).

A buffer insulating layer 219 may be formed on the lower electrode film 217, and the isolated lower electrode 217 and a buffer insulating layer pattern (not shown) may be formed in the storage node hole 215. The buffer insulating layer pattern may optionally be selectively removed to expose an inner wall of the lower electrode 217. In addition, a dielectric material film 224 in which a lower dielectric material film 219 and an upper dielectric material film 223 may be sequentially stacked on a front surface of the semiconductor substrate 201 having the lower electrode 217 may be formed. The upper dielectric material film 223 may be formed of a high dielectric material film having a dielectric constant greater than the lower dielectric material film 219. In addition, the lower dielectric material film 219 may be formed of a dielectric material film having a larger energy bandgap than the upper dielectric material film 223.

An upper electrode 225 may be formed on the upper dielectric material film 223, and the upper electrode 225 may be formed of a metal film having a work function greater than that of the lower electrode 217.

The upper electrode 225 may be formed of at least one noble metal film selected from the group consisting of or including a Ru film, a Pt film, and an Ir film. For example, the upper dielectric material film 223 may be formed as at least one film selected from the group consisting of or including a $Ta_2O_5$ film, a $TiO_2$ film, a douft $TiO_2$ film, and an STO film, and the lower dielectric material film 219 may be formed as at least one film selected from the group consisting of or including a $HfO_2$ film, a $ZrO_2$ film, an $Al_2O_3$ film, and a $La_2O_3$ film.

An intermediate dielectric material film 221 may be between the lower dielectric material film 219 and the upper dielectric material film 223. The lower dielectric material film 219 and the upper dielectric material film 223 may be formed as a crystalline or amorphous dielectric material film, and the intermediate dielectric material film 221 may be formed as a crystalline or amorphous dielectric material film. For example, the lower dielectric material film 219 may be formed as at least one film selected from the group consisting of or including a crystalline or amorphous $HfO_2$ film, $ZrO_2$ film, $Al_2O_3$ film, and $La_2O_3$ film.

In some example embodiments, the intermediate dielectric material film may be formed as at least one single film selected from the group consisting of or including a crystalline or amorphous $HfO_2$ film, $ZrO_2$ film, $Al_2O_3$ film, $La_2O_3$ film, $Ta_2O_5$ film, TiO film, douft TiO film, and STO. In addition, the upper dielectric material film 221 may be formed as at least one film selected from the group consisting of or including a crystalline or amorphous $Ta_2O_5$ film, TiO film, douft TiO film, and STO film. As such, by forming the intermediate dielectric material film 221 as a dielectric material film having a crystalline or amorphous structure, the breakdown voltage characteristic of the dielectric material film 224 may be improved. For example, when the lower dielectric material film 219 and the upper dielectric material film 223 are each formed as a dielectric material film having a crystalline structure, the breakdown voltage of each of the lower dielectric material film 219 and the upper dielectric material film 223 may be improved, but leakage current characteristic thereof may be degraded. Accordingly, the intermediate dielectric material film 221, which is a dielectric material film of an amorphous structure, may be formed between the lower dielectric material film 219 and the upper dielectric material film 223, such that electrical characteristics such as leakage current characteristics and breakdown voltage characteristics of a capacitor may be excellent.

A MIM capacitor shown in FIG. 3A may have a concave structure or a cylinder or prismatic structure.

Figure 3B:
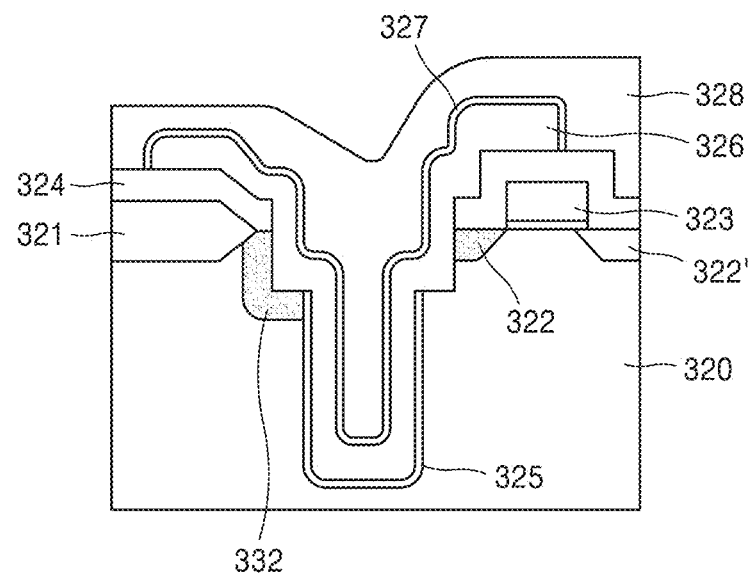
FIG. 3B shows a structure of trench capacitor type dynamic random-access memory (DRAM) according to some example embodiments.

FIG. 3B shows a structure of trench capacitor type dynamic random access memory (DRAM).

A device isolation region may be formed with a field oxidation film 321 on a P-type semiconductor substrate 320, and a transistor such as an access transistor including a gate electrode 323 and source/drain impurity regions 322 and 322' may be formed in the device isolation region. A high temperature oxide (HTO) film may be formed as an interlayer insulating film 324, and after capping a portion where a trench is not to be formed with a trench buffer layer, a part of a source region 22 may be opened to form a contact portion C.

A trench may be formed on or along a sidewall of the interlayer insulating film 324, and a sidewall oxidation film 325 may be formed over the entire sidewall of the trench. The sidewall oxidation film 325 may at least partially compensate for damage to a silicon substrate during etching for trench formation, and also act as a dielectric material film between the silicon substrate and a storage electrode to be formed later. Among the source regions formed on the sidewalls of the trench, an entire sidewall S of the source region 322 may be exposed except for the source region on a gate side.

A PN junction 332 may be formed in the sidewall S of the source region by implantation of impurities, the source region 322 may be formed on a left side of a gate electrode, and a drain region 322 may be formed on a right side of the gate electrode. In addition, a trench T may be formed in the source region 322, and a gate side of the sidewall of the trench may be in direct contact with the source region 322. Impurities are additionally implanted into the source region to form a junction 32.

A layer such as a polysilicon layer may be formed as a storage electrode 26 on a part of an interlayer insulating film 24 and an exposed source region and a surface of the sidewall oxidation film 325 in the trench. In this embodiment, the storage electrode 26 may be formed to contact not only the source region 22 on the gate electrode side but also the entire source region in contact with the periphery of the sidewall on the trench. In addition, the source region formed on the periphery of the sidewall on the trench may be enlarged due to the implanted impurities such that the region may more clearly come into contact with the storage electrode 26. Thereafter, an insulating film 327 may be formed as a dielectric material of a capacitor along an upper surface of the storage electrode, and a process of forming a polysilicon layer as a plate electrode 328 may be performed on the upper surface to complete a trench capacitor type DRAM. As the insulating film 327, the dielectric material single layer thin film according to some example embodiments may be used.

A polysilicon layer may be formed as the storage electrode 326 on a part of the interlayer insulating film 24 and an exposed source region and a surface of the sidewall oxidation film 325 in the trench. As the storage electrode 26 may be formed to contact not only the source region 22 on the gate electrode side but also the entire source region in contact with the periphery of the sidewall on the trench, the contact region may be enlarged such that the region may more clearly come into contact with the storage electrode 26, and a capacity of the capacitor may significantly increase. Thereafter, the insulating film 327 may be formed as a dielectric material of a capacitor along an upper surface of the storage electrode 326, and a process of forming a polysilicon layer as a plate electrode 328 may be performed on the upper surface to complete a trench capacitor type DRAM.

Hereinafter example embodiments will be described in detail with reference to Examples and Comparative Examples. These Examples and Comparative Examples are for illustrative purposes only and are not intended to limit the scope of inventive concepts.

(Manufacture of Thin Film Structure)

Comparative Example 1

Figure 4A:
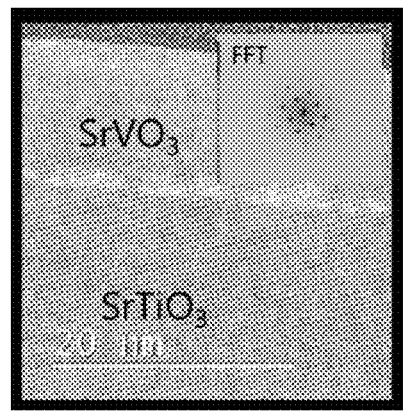
FIG. 4A is a high-resolution transmission electron microscope (HR-TEM) image showing a crystalline structure of a $SrVO_3$ oxide electrode thin film deposited on a $SrTiO_3$ lower substrate in Comparative Example 1.

A thin film structure was manufactured/fabricated by epitaxially depositing a $SrVO_3$ oxide electrode thin film on a single crystalline $SrTiO_3$ lower substrate, by PVD method. The TEM image/TEM micrograph of the deposited $SrVO_3$ oxide electrode thin film is shown in FIG. 4A, along with a Fourier transform of the image. The thickness of the deposited $SrVO_3$ oxide electrode thin film was 15 nm.

Comparative Example 2

A thin film structure was manufactured in the same manner as in Comparative Example 1, except that an antioxidant protective film of $La_{0.1}Sr_{0.9}TiO_{3-\delta}$ ($0.05 \leq \delta \leq 0.3$) was additionally deposited on the $SrVO_3$ oxide electrode thin film by PVD method by Comparative Example 1. The deposition conditions were low oxidation conditions, specifically, oxygen partial pressure of $1.0 \times 10^{-6}$ Torr, and the thickness of the deposited antioxidant protective film was 14 Å (1.4 nm).

Comparative Example 3

A thin film structure was manufactured in the same manner as in Comparative Example 2, except that the thickness of the antioxidant protective film was 26 Å (2.6 nm) Comparative Example 2.

Comparative Example 4

A thin film structure was manufactured in the same manner as in Comparative Example 2, except that the thickness of the antioxidant protective film was 37 Å (3.7 nm) Comparative Example 2.

Example 1

A thin film structure was manufactured in the same manner as in Comparative Example 2, except that the thickness of the antioxidant protective film was 45 Å (4.5 nm) Comparative Example 2.

Example 2

A thin film structure was manufactured in the same manner as in Comparative Example 2, except that the thickness of the antioxidant protective film was 230 Å (23.0 nm) Comparative Example 2.

Evaluation Example 1: Confirmation of Sheet Resistance and Crystal Structure Change after Exposure to High Temperature Oxidation In order to identify whether deterioration prevention or partial prevention of or reduction of the perovskite oxide electrode due to high-temperature oxidation was prevented or significantly prevented through application of the protective film, the sheet resistance and crystalline structure change of the $SrVO_3$ oxide electrode thin film were identified for the thin film structures prepared in Comparative Example 1 and Examples 1 and 2.

FIG. 4A is a high-resolution transmission electron microscope (HR-TEM) image showing a crystalline structure of a $SrVO_3$ oxide electrode thin film deposited on a $SrTiO_3$ lower substrate in Comparative Example 1. In the thin film structure of Comparative Example 1, the sheet resistance of the $SrVO_3$ oxide electrode thin film with a thickness of 15 nm deposited on the $SrTiO_3$ lower substrate was 130 Ω/square, and it was confirmed that the epitaxial thin film was formed through TEM analysis.

After exposing the thin film structure prepared in Comparative Example 1 and Example 1 to a tube furnace at 300° C. and an $O_2$ 500 sccm atmosphere for 30 minutes, the sheet resistance and crystalline structure of the $SrVO_3$ oxide electrode thin film were analyzed. TEM images of the thin film structures prepared in Comparative Example 1 and Example 1 are shown in FIGS. 4B and 4C, respectively, along with respect Fourier transforms showing the crystalline/amorphous structure.

Figure 4B:
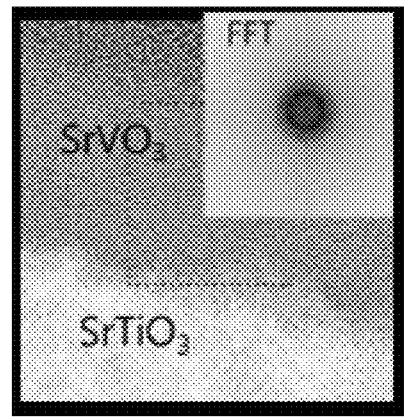
FIG. 4B is an HR-TEM image showing an amorphous structure of a $SrVO_3$ oxide electrode thin film in a thin film structure, to which a protective film is not applied, after exposure to a high-temperature oxidizing environment in Comparative Example 1.

As shown in FIG. 4B, in the case of the thin film structure to which a protective film was not applied in Comparative Example 1, the perovskite crystalline structure of the $SrVO_3$ oxide electrode thin film deteriorated and was changed to an amorphous structure after exposure to high-temperature oxidizing environment, and sheet resistance characteristics were confirmed to be deteriorated to more than 10 MΩ/square, thus losing or degrading its function as an electrode.

Figure 4C:
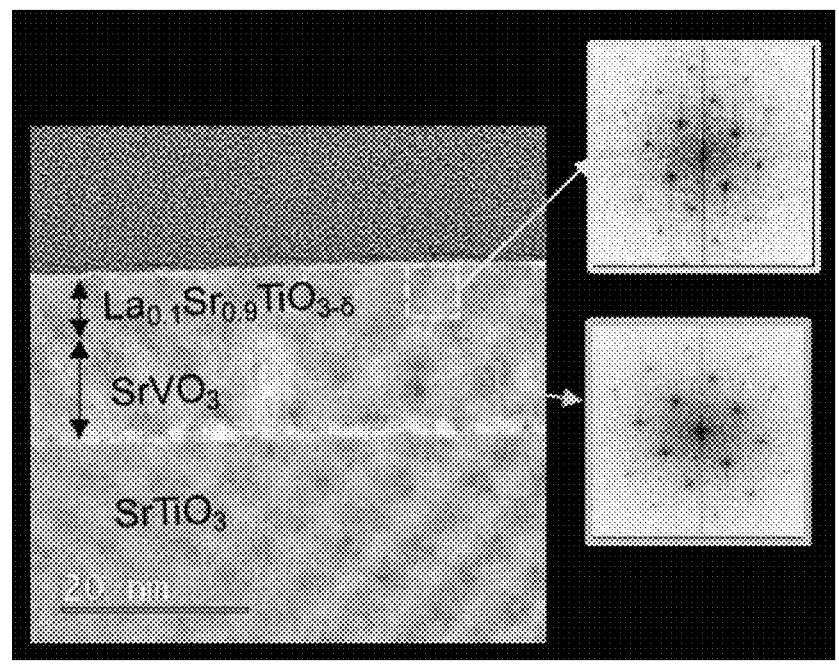
FIG. 4C is an HR-TEM image showing a crystalline structure of a $SrVO_3$ electrode thin film, to which a protective film is applied, and the protective film, after exposure to a high-temperature oxidizing environment in Example 2.

In contrast, as shown in FIG. 4C, in the case of the thin film structure to which the protective film is applied in Example 1, it was confirmed that the perovskite crystalline structure of the protective film and the $SrVO_3$ oxide electrode thin film were maintained even after the same exposure to high-temperature oxidizing environment, and the sheet resistance characteristics were also confirmed that there was no change before/after exposure to a high-temperature oxidizing environment at 130 Ω/square.

Evaluation Example 2: Confirmation of Sheet Resistance and Crystal Structure Change after Exposure to High Temperature Oxidation According to Thickness of Protective Film In order to confirm the oxidation protecting effect according to the thickness of the oxidation protecting protective film, the thin film structures prepared in Comparative Examples 1 to 5 and Examples 1 and 2 with different thicknesses of the protective film were subjected to 300° C. in an ozone ($O_3$) atmosphere in a tube furnace for 30 minutes. Then, the sheet resistance of the $SrVO_3$ oxide electrode thin film was measured, and the results are shown in Table 1. On the other hand, TEM images showing changes in the crystalline structure of some thin film structures are shown in FIGS. 5A to 5E.

Figure 5A:
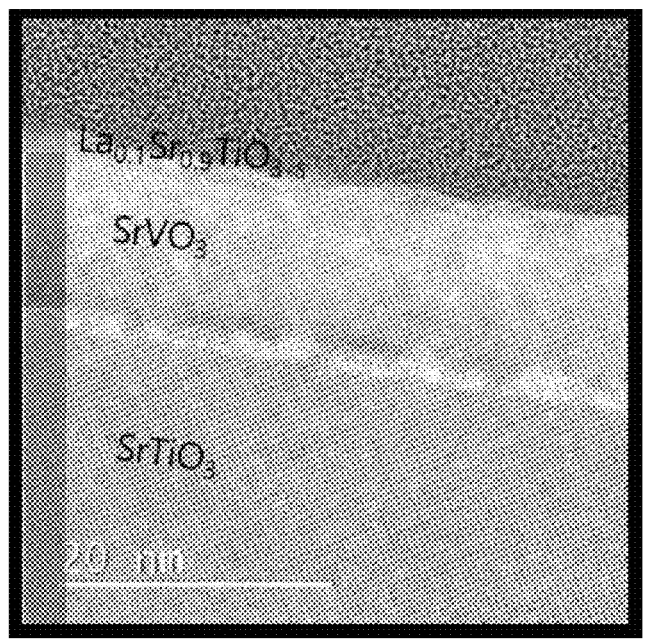
FIGS. 5A to 5D show changes in a crystalline structure of a lower electrode after exposure to a high-temperature oxidizing environment according to a thickness of a protective film.

FIG. 5A is an HR-TEM image showing an as-deposited state of a protective film having a thickness of 26 Å (2.6 nm) on a $SrVO_3$ oxide electrode thin film in Comparative Example 3.

Figure 5B:
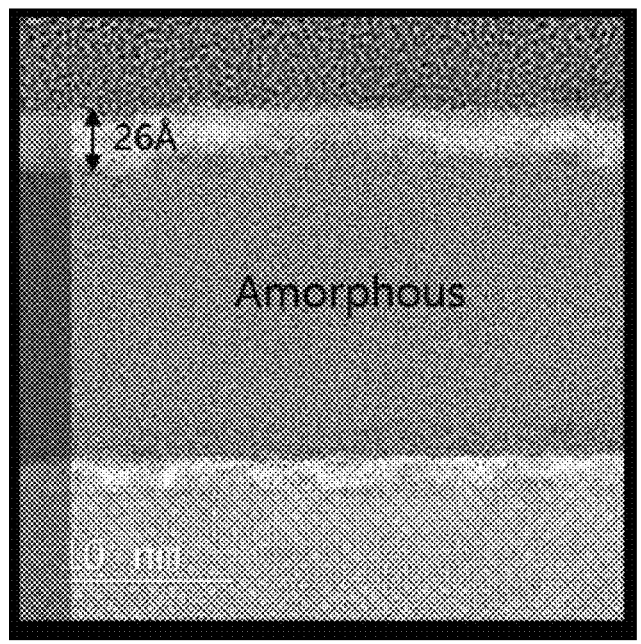

FIG. 5B is an HR-TEM image of an amorphous state of a $SrVO_3$ oxide electrode thin film after exposure to a high-temperature oxidizing environment after depositing a protective film having a thickness of 26 Å (2.6 nm) in Comparative Example 3.

Figure 5C:
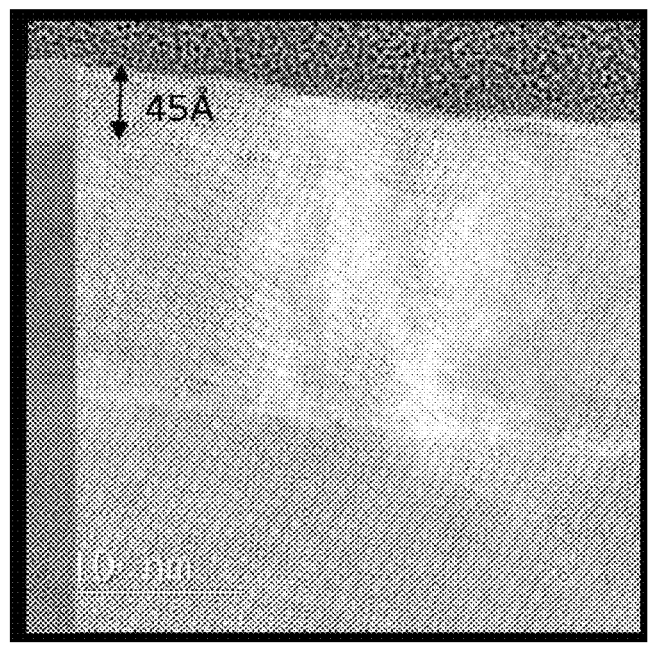

FIG. 5C is an HR-TEM image of a crystalline state of a $SrVO_3$ oxide electrode thin film after exposure to a high-temperature oxidizing environment after depositing a protective film having a thickness of 45 Å (4.5 nm) in Example 1.

Figure 5D:
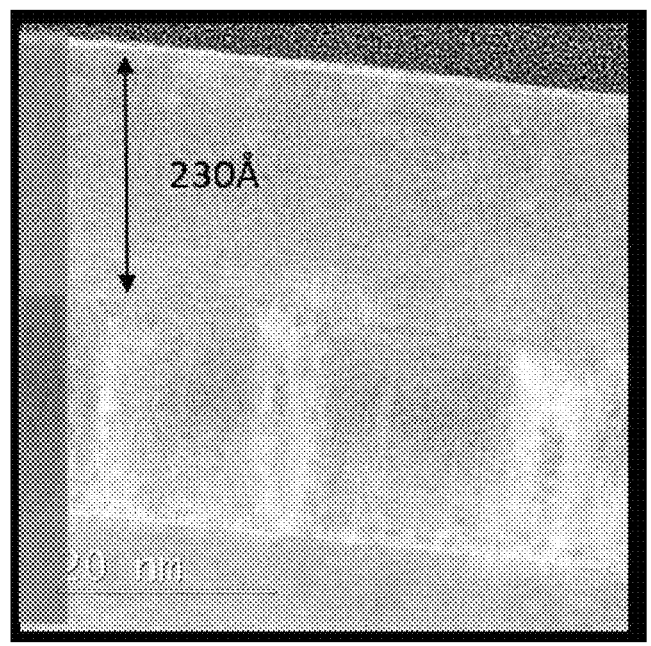

FIG. 5D is an HR-TEM image of a crystalline state of a $SrVO_3$ oxide electrode thin film after exposure to a high-temperature oxidizing environment after depositing a protective film having a thickness of 230 Å (2.30 nm) in Example 2.

TABLE 1

| | Thickness of protective film (Å) | Sheet resistance (Ω/square) | |
|---|---|---|---|
| | | As-deposited | After $O_3$ exposure |
| Comparative Example 1 | 0 | 130 | N/A |
| Comparative Example 2 | 14 | 78 | N/A |
| Comparative Example 3 | 26 | 78 | N/A |
| Comparative Example 4 | 37 | 105 | N/A |
| Example 1 | 45 | 103 | 655 |
| Example 2 | 230 | 109 | 7420 |

* N/A : not applicable in the case of sheet resistance > 10 MΩ/square.

Referring to the results of Table 1 and FIGS. 5A to 5D, when the thickness of the $La_{0.1}Sr_{0.9}TiO_{3-\delta}$ protective film on the $SrVO_3$ oxide electrode was varied from 1.4 nm to 15 nm, and the $La_{0.1}Sr_{0.9}TiO_{3-\delta}$ protective film was exposed to a high-temperature oxidizing atmosphere, it was confirmed that the perovskite crystalline structure and sheet resistance characteristics of the $SrVO_3$ oxide electrode were maintained when the thickness of the protective film was 45 Å (4.5 nm) or greater.

The thin film structure may prevent or reduce deterioration of a conductivity and a crystalline structure of a first electrode including a perovskite-based oxide, which is a lower electrode, even in a high-temperature oxidizing atmosphere for subsequent dielectric film deposition. Alternatively or additionally, the oxidation protecting protective film included in the thin film structure may show electrode characteristics to form a structure capable of forming a MIM capacitor.

Figure 6:
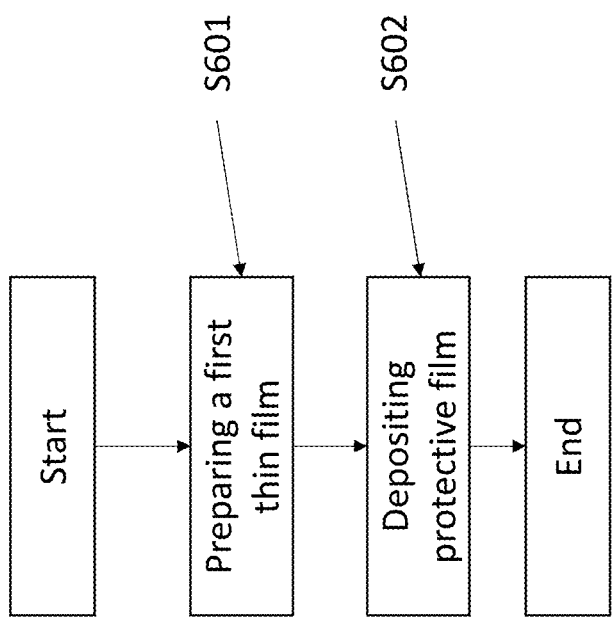
FIG. 6 is a flow chart diagram illustrating a method of manufacturing or fabricating a thin film structure, according to some example embodiments.

FIG. 6 is a schematic flow chart describing a method of fabricating a thin film structure, according to some example embodiments.

Referring to FIG. 6, initially a first thin film may be provisioned (S601). The first thin film may be on, e.g. directly on, a substrate. The first thin film may include a first perovskite-based oxide.

A partially protective film may be deposited (S602). The partially protective film may be deposited on, e.g., directly on, the first thin film. The partially protective film may be deposited on the first thin film for example, with a PVD process such as one or more of pulsed laser deposition (PLD), molecular beam epitaxy (MBE), and sputtering.

The partially protective film may include a second perovskite-based oxide. The second perovskite-based oxide may be oxygen deficient. For example, there may be less oxygen per unit cell in the second perovskite-based oxide than that of the first perovskite-based oxide.

The second perovskite-based oxide may include dopants. For example, dopants may be implanted into the second perovskite-based oxide. Alternatively or additionally, the dopants may be incorporated into the second perovskite-based oxide during deposition of the second perovskite-based oxide.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

It should be understood that various example embodiments described herein should be considered in a descriptive sense only and not for purposes of limitation. Descriptions of features or aspects within each embodiment should typically be considered as available for other similar features or aspects in other embodiments. While some example embodiments have been described with reference to the figures, it will be understood by those of ordinary skill in the art that various changes in form and details may be made therein without departing from the spirit and scope as defined by the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. A thin film structure comprising:
   a first electrode thin film on a substrate and including a first perovskite-based oxide; and
   a protective film on the first electrode thin film and including a second perovskite-based oxide that is oxygen-deficient and comprises a doping element.

2. The thin film structure of claim 1, wherein the second perovskite-based oxide is represented by Formula 1:

$$X_{1-a}Z_aYO_{3-\delta} \quad \text{Formula 1}$$

wherein, in Formula 1,
X is a divalent element,
Y is a quadvalent element,
Z is a doping element that, through doping, causes a biaxial strain ratio of the second perovskite-based oxide to be less than or equal to −1% and greater than or equal to −3%, and
$0<a<1$ and $0<\delta<0.5$.

3. The thin film structure of claim 2, wherein X in Formula 1 is at least one element selected from Sr, Ca, and Ba.

4. The thin film structure of claim 2, wherein Y in Formula 1 is at least one element selected from Ti, Zr, and Hf.

5. The thin film structure of claim 2, wherein Z in Formula 1 is at least one of Ce, La, Pr, Sn, Ge, N, V.

6. The thin film structure of claim 2, wherein a and δ in Formula 1 are respectively in a range of $0.01 \geq a \geq 0.5$ and $0.05 \geq \delta \geq 0.3$.

7. The thin film structure of claim 1, wherein the second perovskite-based oxide is represented by Formula 2:

$$Sr_{1-a}Z'_aTiO_{3-\delta} \quad \text{Formula 2}$$

wherein, in Formula 2,
Z' is at least one of Ce, La, Pr, Sn, Ge, N, V, and
$0.01 \geq a \geq 0.5$ and $0.05 \geq \delta \geq 0.3$.

8. The thin film structure of claim 1, wherein the second perovskite-based oxide includes at least one of $Sr_{1-a}Ce_aTiO_{3-\delta}$, $Sr_{1-a}La_aTiO_{3-\delta}$, $Sr_{1-a}Pr_aTiO_{3-\delta}$, $Sr_{1-a}Sn_aTiO_{3-\delta}$, $Sr_{1-a}Ge_aTiO_{3-\delta}$, $Sr_{1-a}N_aTiO_{3-\delta}$, $Sr_{1-a}V_aTiO_{3-\delta}$, $Sr_{1-a}Ce_aZrO_{3-\delta}$, $Sr_{1-a}La_aZrO_{3-\delta}$, $Sr_{1-a}Pr_aZrO_{3-\delta}$, $Sr_{1-a}Sn_aZrO_{3-\delta}$, $Sr_{1-a}Ge_aZrO_{3-\delta}$, $Sr_{1-a}N_aZrO_{3-\delta}$, $Sr_{1-a}V_aZrO_{3-\delta}$, $Sr_{1-a}Ce_aHfO_{3-\delta}$, $Sr_{1-a}La_aHfO_{3-\delta}$, $Sr_{1-a}Pr_aHfO_{3-\delta}$, $Sr_{1-a}Sn_aHfO_{3-\delta}$, $Sr_{1-a}Ge_aHfO_{3-\delta}$, $Sr_{1-a}N_aHfO_{3-\delta}$, $Sr_{1-a}V_aHfO_{3-\delta}$, $Ca_{1-a}Ce_aTiO_{3-\delta}$, $Ca_{1-a}La_aTiO_{3-\delta}$, $Ca_{1-a}Pr_aTiO_{3-\delta}$, $Ca_{1-a}Sn_aTiO_{3-\delta}$, $Ca_{1-a}Ge_aTiO_{3-\delta}$, $Ca_{1-a}N_aTiO_{3-\delta}$, $Ca_{1-a}V_aTiO_{3-\delta}$, $Ca_{1-a}Ce_aZrO_{3-\delta}$, $Ca_{1-a}La_aZrO_{3-\delta}$, $Ca_{1-a}Pr_aZrO_{3-\delta}$, $Ca_{1-a}Sn_aZrO_{3-\delta}$, $Ca_{1-a}Ge_aZrO_{3-\delta}$, $Ca_{1-a}N_aZrO_{3-\delta}$, $Ca_{1-a}V_aZrO_{3-\delta}$, $Ca_{1-a}Ce_aHfO_{3-\delta}$, $Ca_{1-a}La_aHfO_{3-\delta}$, $Ca_{1-a}Pr_aHfO_{3-\delta}$, $Ca_{1-a}Sn_aHfO_{3-\delta}$, $Ca_{1-a}Ge_aHfO_{3-\delta}$, $Ca_{1-a}N_aHfO_{3-\delta}$, $Ca_{1-a}V_aHfO_{3-\delta}$, $Ba_{1-a}Ce_aTiO_{3-\delta}$, $Ba_{1-a}La_aTiO_{3-\delta}$, $Ba_{1-a}Pr_aTiO_{3-\delta}$, $Ba_{1-a}Sn_aTiO_{3-\delta}$, $Ba_{1-a}Ge_aTiO_{3-\delta}$, $Ba_{1-a}N_aTiO_{3-\delta}$, $Ba_{1-a}V_aTiO_{3-\delta}$, $Ba_{1-a}Ce_aZrO_{3-\delta}$, $Ba_{1-a}La_aZrO_{3-\delta}$, $Ba_{1-a}Pr_aZrO_{3-\delta}$, $Ba_{1-a}Sn_aZrO_{3-\delta}$, $Ba_{1-a}Ge_aZrO_{3-\delta}$, $Ba_{1-a}N_aZrO_{3-\delta}$, $Ba_{1-a}V_aZrO_{3-\delta}$, $Ba_{1-a}Ce_aHfO_{3-\delta}$, $Ba_{1-a}La_aHfO_{3-\delta}$, $Ba_{1-a}Pr_aHfO_{3-\delta}$, $Ba_{1-a}Sn_aHfO_{3-\delta}$, $Ba_{1-a}Ge_aHfO_{3-\delta}$, $Ba_{1-a}N_aHfO_{3-\delta}$, or $Ba_{1-a}V_aHfO_{3-\delta}$,
   wherein, in the above formulae, a is greater than or equal to 0.01 to and less than or equal to 0.5, and δ is greater than or equal to 0.05 and less than or equal to 0.3.

9. The thin film structure of claim 1, wherein a thickness of the protective film is 4.5 nanometers (nm) or greater and 1,000 nm or less.

10. The thin film structure of claim 1, wherein the first perovskite-based oxide is at least one selected from compounds represented by Formulae 3 and 4:

$$ABO_3 \quad \text{Formula 3}$$

wherein, in Formula 3,

A is at least one element selected from Sr, Ca, and Ba, and

B is at least one element selected from Ru, Nb, V, Ti, Fe, and Co, $$La_{1-a}A_aMO_3 \quad \text{Formula 4}$$

in Formula 4, A is at least one element selected from Sr, Ca, and Ba, and

M is at least one element selected from Sc, Ti, V, Cr, Mn, Fe, Co, Ni, Al, and Ru.

11. The thin film structure of claim 1, wherein the first perovskite-based oxide comprises at least one of $SrRuO_3$, $SrNbO_3$, $SrVO_3$, $CaRuO_3$, $CaNbO_3$, $CaVO_3$.

12. The thin film structure of claim 1, wherein the substrate comprises a third perovskite-based oxide.

13. The thin film structure of claim 1, wherein the substrate is a single crystalline substrate comprising at least one of $SrTiO_3$, La-doped $SrTiO_3$, Nb-doped $SrTiO_3$, $LaAlO_3$, $KTaO_3$, $LaSrAlO_4$, $(LaAlO_3)_{0.3}(Sr_2TaAlO_6)_{0.7}$, $YAlO_3$, $DyScO_3$, $TbScO_3$, $GdScO_3$, $EuScO_3$, $SmScO_3$, $NdScO_3$, $PrScO_3$, $CeScO_3$, $LaScO_3$.

14. The thin film structure of claim 1, wherein the first electrode thin film is a film having a property wherein a perovskite crystalline structure of the first electrode thin film is maintained after exposure to a high-temperature oxidizing environment of 300° C. or greater.

15. The thin film structure of claim 1, further comprising:
a dielectric material thin film on the protective film and comprising a fourth perovskite-based oxide.

16. The thin film structure of claim 15, further comprising:
a second electrode thin film comprising a fifth perovskite-based oxide, the second electrode thin film on the dielectric material thin film.

* * * * *